United States Patent
Gytri et al.

(10) Patent No.: US 11,177,131 B2
(45) Date of Patent: *Nov. 16, 2021

(54) METHOD AND APPARATUSES FOR REDUCING POROGEN ACCUMULATION FROM A UV-CURE CHAMBER

(71) Applicant: Novellus Systems, Inc., Fremont, CA (US)

(72) Inventors: Lisa Marie Gytri, Sherwood, OR (US); Jeff Gordon, West Linn, OR (US); James Forest Lee, Damascus, OR (US); Carmen Balderrama, Wilsonville, OR (US); Joseph Brett Harris, Tualatin, OR (US); Eugene Smargiassi, Tualatin, OR (US); Stephen Yu-Hong Lau, Lake Oswego, OR (US); George D. Kamian, Scotts Valley, CA (US); Ming Xi, Palo Alto, CA (US)

(73) Assignee: Novellus Systems, Inc., Fremont, CA (US)

( * ) Notice: Subject to any disclaimer, the term of this patent is extended or adjusted under 35 U.S.C. 154(b) by 555 days.

This patent is subject to a terminal disclaimer.

(21) Appl. No.: 16/029,471

(22) Filed: Jul. 6, 2018

(65) Prior Publication Data
US 2018/0315604 A1 Nov. 1, 2018

Related U.S. Application Data

(60) Continuation of application No. 14/717,806, filed on May 20, 2015, now Pat. No. 10,020,197, which is a
(Continued)

(51) Int. Cl.
*H01L 21/223* (2006.01)
*H01L 21/02* (2006.01)
(Continued)

(52) U.S. Cl.
CPC .............. *H01L 21/223* (2013.01); *B08B 5/02* (2013.01); *B08B 7/00* (2013.01); *B08B 7/0035* (2013.01);
(Continued)

(58) Field of Classification Search
CPC .......... B08B 5/02; B08B 7/00; B08B 7/0035; B08B 7/0057; B08B 7/0071;
(Continued)

(56) References Cited

U.S. PATENT DOCUMENTS

| | | | |
|---|---|---|---|
| 3,504,181 A | 3/1970 | Campbell et al. | |
| 3,704,219 A | 11/1972 | McDowell | |

(Continued)

FOREIGN PATENT DOCUMENTS

| | | | |
|---|---|---|---|
| CN | 1628368 A | 6/2005 | |
| CN | 1930322 A | 3/2007 | |

(Continued)

OTHER PUBLICATIONS

U.S. Office Action, dated Oct. 3, 2007, issued in U.S. Appl. No. 11/115,576.
(Continued)

*Primary Examiner* — Jeffrie R Lund
*Assistant Examiner* — Stanislav Antolin
(74) *Attorney, Agent, or Firm* — Weaver Austin Villeneuve & Sampson LLP

(57) ABSTRACT

Porogen accumulation in a UV-cure chamber is reduced by removing outgassed porogen through a heated outlet while purge gas is flowed across a window through which a wafer is exposed to UV light. A purge ring having specific major and minor exhaust to inlet area ratios may be partially made of flame polished quartz to improve flow dynamics. The
(Continued)

reduction in porogen accumulation allows more wafers to be processed between chamber cleans, thus improving throughput and cost.

20 Claims, 7 Drawing Sheets

Related U.S. Application Data division of application No. 13/776,527, filed on Feb. 25, 2013, now Pat. No. 9,073,100, which is a continuation of application No. 12/132,559, filed on Jun. 3, 2008, now Pat. No. 8,398,816, and a continuation-in-part of application No. 13/562,421, filed on Jul. 31, 2012, now Pat. No. 8,518,210, which is a continuation of application No. 12/586,175, filed on Sep. 18, 2009, now Pat. No. 8,282,768, which is a division of application No. 11/391,134, filed on Mar. 28, 2006, now abandoned.

(60) Provisional application No. 60/742,844, filed on Dec. 5, 2005.

(51) Int. Cl.
*H01L 21/67* (2006.01)
*B08B 7/00* (2006.01)
*B08B 5/02* (2006.01)
*H01L 21/26* (2006.01)

(52) U.S. Cl.
CPC .......... *B08B 7/0057* (2013.01); *B08B 7/0071* (2013.01); *H01L 21/02041* (2013.01); *H01L 21/02203* (2013.01); *H01L 21/02348* (2013.01); *H01L 21/26* (2013.01); *H01L 21/67017* (2013.01); *H01L 21/67115* (2013.01)

(58) Field of Classification Search
CPC ..... C23C 16/345; C23C 16/401; C23C 16/56; H01L 21/02041; H01L 21/02126; H01L 21/0217; H01L 21/02203; H01L 21/00271; H01L 21/02274; H01L 21/02282; H01L 21/02348; H01L 21/223; H01L 21/26; H01L 21/3105; H01L 21/67017; H01L 21/67103; H01L 21/67109; H01L 21/67115; H01L 21/68764; H01L 21/68771
See application file for complete search history.

(56) References Cited

U.S. PATENT DOCUMENTS

| | | |
|---|---|---|
| 4,527,620 A | 7/1985 | Pedersen et al. |
| 4,563,589 A | 1/1986 | Scheffer |
| 4,654,226 A * | 3/1987 | Jackson ................ C23C 16/488 118/50.1 |
| 4,832,777 A * | 5/1989 | Davis ................ H01L 21/67115 118/725 |
| 4,834,022 A | 5/1989 | Mahawili |
| 4,872,947 A | 10/1989 | Wang et al. |
| 4,927,786 A | 5/1990 | Nishida |
| 4,956,582 A | 9/1990 | Bourassa |
| 5,005,519 A | 4/1991 | Egermeier et al. |
| 5,049,739 A | 9/1991 | Okamoto |
| 5,150,253 A | 9/1992 | Watanuki et al. |
| 5,166,101 A | 11/1992 | Lee et al. |
| 5,174,881 A | 12/1992 | Iwasaki et al. |
| 5,178,682 A | 1/1993 | Tsukamoto et al. |
| 5,195,045 A | 3/1993 | Keane et al. |
| 5,240,746 A | 8/1993 | O'Connell Litteral |
| 5,282,121 A | 1/1994 | Bornhorst et al. |
| 5,288,684 A | 2/1994 | Yamazaki et al. |
| 5,298,939 A | 3/1994 | Swanson et al. |
| 5,314,538 A | 5/1994 | Maeda et al. |
| 5,354,715 A | 10/1994 | Wang et al. |
| 5,407,524 A | 4/1995 | Patrick et al. |
| 5,413,664 A | 5/1995 | Yagi et al. |
| 5,426,076 A | 6/1995 | Moghadam et al. |
| 5,518,959 A | 5/1996 | Jang et al. |
| 5,552,927 A | 9/1996 | Wheatly et al. |
| 5,556,549 A | 9/1996 | Patrick et al. |
| 5,558,717 A * | 9/1996 | Zhao ................... C23C 16/4401 118/715 |
| 5,667,592 A | 9/1997 | Boitnott et al. |
| 5,674,783 A | 10/1997 | Jang et al. |
| 5,795,448 A | 8/1998 | Hurwitt et al. |
| 5,833,290 A | 11/1998 | Curelop et al. |
| 5,958,510 A | 9/1999 | Sivaramakrishnam et al. |
| 5,962,085 A * | 10/1999 | Hayashi .................. B05D 3/065 427/585 |
| 5,994,678 A * | 11/1999 | Zhao .................... C23C 16/4586 118/722 |
| 6,015,503 A | 1/2000 | Butterbaugh et al. |
| 6,044,329 A | 3/2000 | Kidd |
| 6,080,965 A | 6/2000 | Osawa |
| 6,143,063 A * | 11/2000 | Hayashi ............ H01L 27/11502 106/287.18 |
| 6,232,248 B1 | 5/2001 | Shinriki et al. |
| 6,235,112 B1 | 5/2001 | Satoh |
| 6,239,018 B1 | 5/2001 | Liu et al. |
| 6,242,717 B1 | 6/2001 | Sanderson |
| 6,244,575 B1 | 6/2001 | Vaartstra et al. |
| 6,259,061 B1 | 7/2001 | Osawa |
| 6,284,050 B1 | 9/2001 | Shi et al. |
| 6,288,493 B1 | 9/2001 | Lee et al. |
| 6,291,800 B1 * | 9/2001 | Shirakawa ............... G03F 7/168 118/724 |
| 6,394,797 B1 | 5/2002 | Sugaya et al. |
| 6,467,491 B1 | 10/2002 | Sugiura et al. |
| 6,475,854 B2 | 11/2002 | Narwanker et al. |
| 6,497,783 B1 * | 12/2002 | Suzuki .............. H01J 37/32192 156/345.1 |
| 6,519,036 B1 | 2/2003 | Hickman |
| 6,524,389 B1 | 2/2003 | Katayama et al. |
| 6,530,380 B1 | 3/2003 | Zhou et al. |
| 6,563,092 B1 | 5/2003 | Shrinivasan et al. |
| 6,568,346 B2 | 5/2003 | Pu et al. |
| 6,629,012 B1 | 9/2003 | Riley et al. |
| 6,756,085 B2 | 6/2004 | Waldfried et al. |
| 6,808,163 B2 | 10/2004 | Lee et al. |
| 6,821,906 B2 | 11/2004 | Wada et al. |
| 6,900,413 B2 | 5/2005 | Ratliff et al. |
| 7,018,479 B2 | 3/2006 | Goodwin |
| 7,020,238 B1 | 3/2006 | Kantonen et al. |
| 7,025,831 B1 | 4/2006 | Butterbaugh et al. |
| 7,067,819 B2 | 6/2006 | Janik |
| 7,087,497 B2 | 8/2006 | Yuan et al. |
| 7,094,713 B1 | 8/2006 | Niu et al. |
| 7,097,712 B1 | 8/2006 | Yamazaki et al. |
| 7,160,813 B1 | 1/2007 | Chen et al. |
| 7,169,256 B2 | 1/2007 | Dhindsa et al. |
| 7,176,144 B1 | 2/2007 | Wang et al. |
| 7,214,630 B1 | 5/2007 | Varadarajan et al. |
| 7,244,672 B2 | 7/2007 | Nguyen et al. |
| 7,256,111 B2 | 8/2007 | Lopatin et al. |
| 7,264,676 B2 | 9/2007 | Lai et al. |
| 7,301,148 B2 | 11/2007 | Johnson |
| 7,304,302 B1 | 12/2007 | Nunan et al. |
| 7,327,948 B1 * | 2/2008 | Shrinivasan ............ C23C 16/56 118/724 |
| 7,332,445 B2 | 2/2008 | Lukas et al. |
| 7,394,067 B1 | 7/2008 | Soltz et al. |
| 7,453,560 B2 | 11/2008 | Miyake |
| 7,638,780 B2 | 12/2009 | Kilburn et al. |
| 7,642,205 B2 | 1/2010 | Timans |
| 7,704,894 B1 | 4/2010 | Henry et al. |
| 7,772,527 B2 | 8/2010 | Choi |
| 7,790,243 B2 | 9/2010 | Radhakrishnan et al. |
| 7,935,940 B1 | 5/2011 | Smargiassi |

(56) References Cited

U.S. PATENT DOCUMENTS

| | | | |
|---|---|---|---|
| 7,941,039 B1 * | 5/2011 | Shrinivasan | C23C 16/56 392/416 |
| 7,960,297 B1 | 6/2011 | Rivkin et al. | |
| 7,993,937 B2 | 8/2011 | Chen et al. | |
| 8,058,181 B1 | 11/2011 | Chen et al. | |
| 8,075,789 B1 | 12/2011 | Littau et al. | |
| 8,137,465 B1 * | 3/2012 | Shrinivasan | H01L 21/67109 118/719 |
| 8,211,510 B1 | 7/2012 | Varadarajan et al. | |
| 8,246,778 B2 | 8/2012 | Lu et al. | |
| 8,282,768 B1 * | 10/2012 | Smargiassi | H01L 21/02348 156/345.33 |
| 8,283,644 B2 | 10/2012 | Smargiassi et al. | |
| 8,398,816 B1 * | 3/2013 | Gytri | H01L 21/02203 156/345.5 |
| 8,454,750 B1 * | 6/2013 | Shrinivasan | C23C 16/401 118/719 |
| 8,512,818 B1 | 8/2013 | Varadarajan et al. | |
| 8,518,210 B2 * | 8/2013 | Smargiassi | H01L 21/02348 156/345.33 |
| 8,608,035 B2 * | 12/2013 | Lee | G03B 27/52 222/566 |
| 8,629,068 B1 * | 1/2014 | Shrinivasan | C23C 16/401 438/795 |
| 8,734,663 B2 * | 5/2014 | Smargiassi | C23C 16/401 118/719 |
| 8,883,406 B2 * | 11/2014 | Lee | F15D 1/0005 430/325 |
| 8,889,233 B1 * | 11/2014 | Kelman | H01L 21/68771 427/508 |
| 8,951,348 B1 * | 2/2015 | Shrinivasan | H01L 21/67109 118/725 |
| 8,980,769 B1 * | 3/2015 | Haverkamp | H01L 21/02203 438/795 |
| 9,028,765 B2 * | 5/2015 | Gytri | H01J 37/32834 422/186.3 |
| 9,073,100 B2 * | 7/2015 | Gytri | B08B 5/02 |
| 9,384,959 B2 | 7/2016 | Smargiassi et al. | |
| 9,916,977 B2 | 3/2018 | Van Cleemput et al. | |
| 10,020,197 B2 * | 7/2018 | Gytri | H01J 37/32834 422/186.3 |
| 10,121,682 B2 * | 11/2018 | Smargiassi | H01L 21/324 438/778 |
| 10,388,546 B2 | 8/2019 | Mohn et al. | |
| 2001/0018267 A1 * | 8/2001 | Shinriki | C23C 16/56 438/680 |
| 2001/0054381 A1 | 12/2001 | Umotoy et al. | |
| 2002/0017242 A1 | 2/2002 | Hamaguchi et al. | |
| 2002/0117109 A1 | 8/2002 | Hazelton et al. | |
| 2002/0134439 A1 | 9/2002 | Kawasaki et al. | |
| 2002/0148563 A1 | 10/2002 | Carlson et al. | |
| 2002/0170484 A1 | 11/2002 | Katamine et al. | |
| 2003/0007917 A1 | 1/2003 | Ohmi et al. | |
| 2003/0013280 A1 | 1/2003 | Yamanaka | |
| 2003/0015669 A1 * | 1/2003 | Janos | G03F 7/70575 250/492.2 |
| 2003/0150560 A1 * | 8/2003 | Kinnard | C23C 16/455 156/345.33 |
| 2003/0194493 A1 | 10/2003 | Chang et al. | |
| 2003/0199603 A1 | 10/2003 | Walker et al. | |
| 2003/0200931 A1 | 10/2003 | Goodwin | |
| 2004/0023513 A1 * | 2/2004 | Aoyama | H01J 37/32009 438/778 |
| 2004/0025787 A1 | 2/2004 | Selbrede et al. | |
| 2004/0082163 A1 | 4/2004 | Mori et al. | |
| 2004/0096593 A1 | 5/2004 | Lukas et al. | |
| 2004/0221871 A1 | 11/2004 | Fletcher et al. | |
| 2004/0266214 A1 | 12/2004 | Suguro et al. | |
| 2005/0006916 A1 | 1/2005 | Mantz | |
| 2005/0016687 A1 | 1/2005 | Shinriki et al. | |
| 2005/0056369 A1 | 3/2005 | Lai et al. | |
| 2005/0072716 A1 | 4/2005 | Quiles et al. | |
| 2005/0085094 A1 | 4/2005 | Yoo | |
| 2005/0098553 A1 | 5/2005 | Devine et al. | |
| 2005/0109276 A1 | 5/2005 | Iyer et al. | |
| 2005/0190248 A1 | 9/2005 | Konno et al. | |
| 2005/0196929 A1 | 9/2005 | Yuan et al. | |
| 2005/0255712 A1 | 11/2005 | Kato et al. | |
| 2005/0263719 A1 | 12/2005 | Ohdaira et al. | |
| 2005/0264218 A1 | 12/2005 | Dhindsa et al. | |
| 2006/0021568 A1 | 2/2006 | Matsumoto | |
| 2006/0074153 A1 | 4/2006 | Boisseau et al. | |
| 2006/0105106 A1 | 5/2006 | Balseanu et al. | |
| 2006/0141806 A1 * | 6/2006 | Waldfried | H01L 21/324 438/778 |
| 2006/0216839 A1 | 9/2006 | Shemesh et al. | |
| 2006/0269693 A1 | 11/2006 | Balseanu et al. | |
| 2007/0034159 A1 * | 2/2007 | Komino | F16L 53/35 118/725 |
| 2007/0134821 A1 | 6/2007 | Thakur | |
| 2007/0161230 A1 | 7/2007 | Chen et al. | |
| 2007/0196011 A1 | 8/2007 | Cox et al. | |
| 2007/0218204 A1 * | 9/2007 | Garg | C03C 15/00 427/255.11 |
| 2007/0235660 A1 | 10/2007 | Hudson | |
| 2007/0289534 A1 | 12/2007 | Lubomirsky et al. | |
| 2008/0053615 A1 | 3/2008 | Sago et al. | |
| 2008/0286697 A1 | 11/2008 | Verhaverbeke et al. | |
| 2009/0059406 A1 | 3/2009 | Powers et al. | |
| 2010/0055904 A1 | 3/2010 | Chen et al. | |
| 2010/0267231 A1 | 10/2010 | Van Schravendijk et al. | |
| 2011/0070665 A1 | 3/2011 | Chen et al. | |
| 2011/0262870 A1 | 10/2011 | Lee et al. | |
| 2012/0091097 A1 | 4/2012 | Chen et al. | |
| 2012/0132618 A1 | 5/2012 | Baluja et al. | |
| 2012/0161021 A1 | 6/2012 | Smargiassi et al. | |
| 2013/0160946 A1 * | 6/2013 | Smargiassi | H01L 21/67207 156/345.5 |
| 2013/0284087 A1 * | 10/2013 | Gytri | H01L 21/02203 118/642 |
| 2013/0298940 A1 * | 11/2013 | Smargiassi | H01L 21/02348 134/1 |
| 2014/0065557 A1 | 3/2014 | Lee et al. | |
| 2014/0080324 A1 * | 3/2014 | Shrinivasan | H01L 21/02203 156/345.5 |
| 2014/0230861 A1 | 8/2014 | Smargiassi et al. | |
| 2014/0329027 A1 | 11/2014 | Liang et al. | |
| 2015/0056108 A1 | 2/2015 | Gytri et al. | |
| 2015/0114292 A1 | 4/2015 | Haverkamp et al. | |
| 2015/0255285 A1 | 9/2015 | Gytri et al. | |
| 2016/0284574 A1 | 9/2016 | Smargiassi et al. | |
| 2017/0137943 A1 | 5/2017 | Mohn et al. | |
| 2018/0315604 A1 * | 11/2018 | Gytri | B08B 5/02 |
| 2019/0333790 A1 | 10/2019 | Mohn et al. | |

FOREIGN PATENT DOCUMENTS

| | | | |
|---|---|---|---|
| CN | 101171367 A | 4/2008 | |
| CN | 102365389 A | 2/2012 | |
| EP | 0 296 891 | 12/1988 | |
| JP | 63307740 | 12/1988 | |
| JP | 01-107519 | 4/1989 | |
| JP | 05-031735 | 2/1993 | |
| JP | 05-138658 | 6/1993 | |
| JP | 62-229833 | 10/1997 | |
| JP | 11-214364 | 8/1999 | |
| JP | 2001-104776 | 4/2001 | |
| JP | 2006-003608 A | 1/2006 | |
| JP | 2007-194582 | 8/2007 | |
| JP | 2008-008848 A | 1/2008 | |
| KR | 10-2008-0018946 | 2/2008 | |
| TW | 2008-07510 A | 2/2008 | |
| TW | 2008-09927 A | 2/2008 | |
| TW | 2008-09965 A | 2/2008 | |
| TW | 2014-47019 A | 12/2014 | |
| WO | 2000-0043888 | 7/2000 | |
| WO | WO 02/40740 A1 | 5/2002 | |
| WO | WO-0240740 A1 * | 5/2002 | C23C 16/455 |
| WO | WO 2004/105103 A1 | 12/2004 | |
| WO | WO-2004105103 A1 * | 12/2004 | F16L 53/35 |

(56) References Cited

FOREIGN PATENT DOCUMENTS

| WO | WO 2006/104583 | 10/2006 |
|----|----|----|
| WO | WO 2006/127463 | 11/2006 |
| WO | WO 2007/001281 A1 | 1/2007 |

OTHER PUBLICATIONS

U.S. Final Office Action, dated May 2, 2008, issued in U.S. Appl. No. 11/115,576.
U.S. Office Action, dated Oct. 17, 2008, issued in U.S. Appl. No. 11/115,576.
U.S. Final Office Action, dated Apr. 22, 2009, issued in U.S. Appl. No. 11/115,576.
U.S. Office Action, dated Oct. 1, 2009, issued in U.S. Appl. No. 11/115,576.
U.S. Final Office Action, dated Apr. 15, 2010, issued in U.S. Appl. No. 11/115,576.
U.S. Office Action, dated Oct. 1, 2010, issued in U.S. Appl. No. 11/115,576.
U.S. Final Office Action, dated May 9, 2011, issued in U.S. Appl. No. 11/115,576.
U.S. Notice of Allowance, dated Nov. 14, 2011, issued in U.S. Appl. No. 11/115,576.
U.S. Office Action, dated Oct. 23, 2012, issued in U.S. Appl. No. 13/370,579.
U.S. Office Action, dated Jun. 4, 2013, issued in U.S. Appl. No. 13/370,579.
U.S. Final Office Action, dated Jan. 27, 2014, issued in U.S. Appl. No. 13/370,579.
U.S. Office Action, dated Apr. 25, 2014, issued in U.S. Appl. No. 13/370,579.
U.S. Notice of Allowance, dated Sep. 25, 2014, issued in U.S. Appl. No. 13/370,579.
U.S. Notice of Allowance, dated Nov. 24, 2014, issued in U.S. Appl. No. 13/370,579.
U.S. Office Action, dated Jun. 11, 2009, issued in U.S. Appl. No. 11/688,695.
U.S. Final Office Action, dated Dec. 31, 2009, issued in U.S. Appl. No. 11/688,695.
U.S. Office Action, dated Jul. 23, 2010, issued in U.S. Appl. No. 11/688,695.
U.S. Final Office Action, dated Feb. 1, 2011, issued in U.S. Appl. No. 11/688,695.
U.S. Office Action, dated Dec. 14, 2011, issued in U.S. Appl. No. 11/688,695.
U.S. Final Office Action, dated Jun. 21, 2012, issued in U.S. Appl. No. 11/688,695.
U.S. Notice of Allowance, dated Oct. 4, 2012, issued in U.S. Appl. No. 11/688,695.
U.S. Notice of Allowance, dated Feb. 14, 2013, issued in U.S. Appl. No. 11/688,695.
U.S. Office Action (Ex Parte Quayle), dated Jul. 19, 2013, issued in U.S. Appl. No. 13/886,694.
U.S. Notice of Allowance, dated Sep. 12, 2013, issued in U.S. Appl. No. 13/886,694.
U.S. Office Action, dated May 31, 2012, issued in U.S. Appl. No. 12/726,263.
U.S. Final Office Action, dated Sep. 10, 2012, issued in U.S. Appl. No. 12/726,263.
U.S. Office Action, dated Mar. 6, 2013, issued in U.S. Appl. No. 12/726,263.
U.S. Final Office Action, dated Aug. 7, 2013, issued in U.S. Appl. No. 12/726,263.
U.S. Office Action dated Jul. 11, 2011 issued in U.S. Appl. No. 11/897,838.
U.S. Notice of Allowance dated Mar. 2, 2012 issued in U.S. Appl. No. 11/897,838.
U.S. Office Action, dated Jan. 3, 2013, issued in U.S. Appl. No. 13/487,051.
U.S. Notice of Allowance, dated Apr. 22, 2013, issued in U.S. Appl. No. 13/487,051.
U.S. Office Action, dated May 20, 2011, issued in U.S. Appl. No. 12/001,348.
U.S. Office Action, dated Nov. 25, 2011, issued in U.S. Appl. No. 12/001,348.
U.S. Office Action, dated Mar. 26, 2012, issued in U.S. Appl. No. 12/001,348.
U.S. Final Office Action, dated Aug. 15, 2012, issued in U.S. Appl. No. 12/001,348.
U.S. Notice of Allowance, dated Dec. 5, 2012, issued in U.S. Appl. No. 12/001,348.
U.S. Office Action, dated Mar. 17, 2010, issued in U.S. Appl. No. 12/008,149.
U.S. Notice of Allowance, dated Nov. 19, 2010, issued in U.S. Appl. No. 12/008,149.
U.S. Notice of Allowance, dated Jun. 7, 2012, issued in U.S. Appl. No. 13/070,306.
U.S. Office Action, dated Nov. 19, 2010, issued in U.S. Appl. No. 12/132,559.
U.S. Final Office Action, dated Jun. 9, 2011, issued in U.S. Appl. No. 12/132,559.
U.S. Office Action, dated Nov. 22, 2011, issued in U.S. Appl. No. 12/132,559.
U.S. Office Action, dated Mar. 22, 2012, issued in U.S. Appl. No. 12/132,559.
U.S. Final Office Action, dated Jul. 12, 2012, issued in U.S. Appl. No. 12/132,559.
U.S. Notice of Allowance, dated Oct. 25, 2012, issued in U.S. Appl. No. 12/132,559.
U.S. Notice of Allowance, dated Feb. 11, 2013, issued in U.S. Appl. No. 12/132,559.
U.S. Office Action, dated Aug. 6, 2014, issued in U.S. Appl. No. 13/776,527.
U.S. Notice of Allowance, dated Mar. 2, 2015, issued in U.S. Appl. No. 13/776,527.
U.S. Office Action, dated Aug. 7, 2017, issued in U.S. Appl. No. 14/717,806.
U.S. Notice of Allowance dated Mar. 2, 2018 in U.S. Appl. No. 14/717,806.
U.S. Notice of Allowance, dated Jan. 7, 2015 issued in U.S. Appl. No. 13/974,540.
Chinese First Office Action, dated Sep. 5, 2016, issued in Application No. CN 201410421492.1.
Taiwanese First Office Action, dated Oct. 31, 2017, issued in Application No. TW 103128843.
U.S. Appl. No. 11/561,834, filed Nov. 20, 2006, Kamian et al.
U.S. Appl. No. 11/391,134, filed Mar. 28, 2006, Smargiassi et al.
U.S. Office Action, dated May 21, 2010, issued in U.S. Appl. No. 11/561,834.
U.S. Final Office Action, dated Dec. 3, 2010, issued in U.S. Appl. No. 11/561,834.
Korean First Office Action dated Jul. 30, 2018 issued in Application No. KR 10-2012-0029915.
Korean Second Office Action dated Mar. 17, 2019 issued in Application No. KR 10-2012-0029915.
U.S. Appl. No. 16/509,236, filed Jul. 25, 2019, Mohn et al.
U.S. Office Action dated Dec. 10, 2020 in U.S. Appl. No. 16/509,236.
U.S. Office Action, dated May 18, 2018, issued in U.S. Appl. No. 14/942,703.
U.S. Final Office Action, dated Dec. 21, 2018, issued in U.S. Appl. No. 14/942,703.
U.S. Notice of Allowance, dated Mar. 26, 2019, issued in U.S. Appl. No. 14/942,703.
Taiwanese First Office Action dated May 7, 2020 issued in Application No. TW 105137199.
U.S. Final Office Action dated Jul. 19, 2021 issued in U.S. Appl. No. 16/509,236.

\* cited by examiner

METHOD AND APPARATUSES FOR REDUCING POROGEN ACCUMULATION FROM A UV-CURE CHAMBER

RELATED APPLICATIONS

This application is a continuation of U.S. patent application Ser. No. 14/717,806, filed May 20, 2015, which is titled "METHOD AND APPARATUSES FOR REDUCING POROGEN ACCUMULATION FROM A UV-CURE CHAMBER" and which will issue as U.S. patent Ser. No. 10/020,197 on Jul. 10, 2018, and is itself a divisional of U.S. patent application Ser. No. 13/776,527, filed Feb. 25, 2013, which is titled "METHODS AND APPARATUSES FOR REDUCING POROGEN ACCUMULATION FROM A UV-CURE CHAMBER" and which issued as U.S. Pat. No. 9,073,100 on Jul. 7, 2015, and is itself a continuation of U.S. patent application Ser. No. 12/132,559, filed Jun. 3, 2008, which is titled "METHODS AND APPARATUSES FOR REDUCING POROGEN ACCUMULATION FROM A UV-CURE CHAMBER" and which issued as U.S. Pat. No. 8,398,816 on Mar. 19, 2013; U.S. patent application Ser. No. 13/776,527 is also a continuation-in-part of U.S. patent application Ser. No. 13/562,421, filed Jul. 31, 2012, which is titled "PURGING OF POROGEN FROM UV CURE CHAMBER," issued as U.S. Pat. No. 8,518,210 on Aug. 27, 2013, and is itself a continuation of U.S. patent application Ser. No. 12/586,175, filed Sep. 18, 2009, which is titled "PURGING OF POROGEN FROM UV CURE CHAMBER," issued as U.S. Pat. No. 8,282,768 on Oct. 9, 2012, and is itself a divisional of U.S. patent application Ser. No. 11/391,134, filed Mar. 28, 2006, which is titled "PURGING OF POROGEN FROM UV CURE CHAMBER" and which claims benefit of U.S. Provisional Patent Application No. 60/742,844, filed Dec. 5, 2005, and titled "PURGING OF POROGEN FROM UV CURE CHAMBER," all of which are hereby incorporated herein by reference in their entireties.

FIELD OF THE INVENTION

The invention is related to the field of integrated circuit fabrication, in particular to methods and apparatuses for purging and cleaning process chambers used in the annealing and curing of semiconductor wafers.

BACKGROUND

As integrated circuit (IC) feature sizes shrink, problems of increased resistance and resistance-capacitance (RC) coupling offset any speed advantage derived from the smaller device size, limiting improvement in device performance. Ways to improve device performance and reliability include using highly conductive metals, such as copper, and employing lower dielectric constant (low-k) materials. The lower the dielectric constant of the dielectric, the lower the capacitance of the dielectric and the lower the RC delay of the IC.

Low k dielectrics are conventionally defined as those materials that have a dielectric constant lower than that of silicon dioxide, that is k<~4. Typical methods of obtaining low-k materials include doping silicon dioxide with various hydrocarbons or fluorine. These doping methods, however, generally cannot produce materials with dielectric constants lower than about 2.6. With more and more advanced technology needs, present efforts are focused on developing low-k dielectric materials with k less than 2.5. These ultra low-k (ULK) dielectrics can be obtained by incorporating air voids within a low-k dielectric, creating a porous dielectric material.

Methods of fabricating porous dielectrics typically involve forming a composite film (sometimes referred to herein as a "precursor film") containing two components: a porogen (typically an organic material such as a polymer) and a structure former or dielectric material (e.g., a silicon containing material). Once the composite film is formed on the substrate, the porogen component is removed, leaving a structurally intact porous dielectric matrix. Techniques for removing porogens from the composite film include, for example, a thermal process in which the substrate is heated to a temperature sufficient for the breakdown and vaporization of the organic porogen. These thermal processes, however, have certain difficulties. In particular, substrate temperatures generally need to be high (i.e., greater than about 400° C.) with exposure times typically on the order of hours. As is well known in the field, these conditions can damage copper containing devices.

Methods have been developed to form a porous low-k or ultra-low-k (ULK) film of dielectric material by first forming a precursor film that contains a porogen and a structure former, or "backbone", on a substrate, and then exposing the precursor film to ultra-violet radiation (UV) in a curing process to remove the porogen. The method is disclosed in U.S. patent application Ser. No. 11/115,576 filed Apr. 26, 2005, issued as U.S. Pat. No. 8,137,465 on Mar. 20, 2012, and having the title "Single Chamber Sequential Curing of Semiconductor Wafers", which is hereby incorporated by reference for all purposes.

The porogens evolved from low-k and ULK dielectric films in a UV curing chamber during a curing process tend to form porogen deposits on internal chamber parts and a quartz window through which ultraviolet curing (UVC) light is transmitted into a curing chamber. The resulting porogen deposit may become a source of particle contamination and a visual blemish. Deposits on the quartz window inhibit UVC light transmission and thus limit the number of wafers processed between chamber and window cleans.

SUMMARY OF THE INVENTION

Porogen is outgassed during UV curing of ULK film and may deposit on a window or other internal chamber parts. Accumulated porogen in the chamber may contaminate wafers. Porogen accumulation in a UV-cure chamber is reduced by removing outgassed porogen through an outlet while purge gas is flowed across a window through which a wafer is exposed to UV light. A purge ring having specific major and minor exhaust to inlet area ratios may be made of flame polished quartz. The reduction in porogen accumulation improves throughput and cost by allowing more wafers to be processed between chamber cleans and/or to reduce the duration of chamber cleans. One improvement in chamber cleans is to direct the cleaning gas and the porogen-laden gas at the same specific chamber location for more effective cleans.

In one aspect, the invention pertains to a UV cure chamber for curing porogen containing ULK film. The chamber includes one or more cure stations. Each station includes a window having two sides, a UV light source mounted on one side of the window, a wafer support exposed to the UV source that is positioned on the other side of the window, and an inlet and outlet for purge gas positioned across from each other on the wafer support side of the window.

The major outlet to inlet surface area ratio is greater than about 4, 5, or is about 6 for at least one station. As used in this disclosure, the major outlet surface area is an imaginary combined sectional surface area perpendicular to the wafer plane of all features of any geometry that are used for exhausting gases. Note that while the imaginary surface is perpendicular to the wafer plane, the actual hardware need not be. The major inlet surface area is the combined inlet sectional surface area of all features of any geometry that serve as final restrictions on the inlet path of a gas. These surface areas may be calculated using an imaginary surface that is perpendicular to the direction of gas flow. The surface need not be planar.

The minor outlet to inlet surface area ratio is greater than about 2, 2.5 or is about 3. The minor outlet surface area is a cross sectional area of primary gas exhaust opening used to remove gases from the purge system. The minor inlet surface area is the cross sectional area of primary gas delivery opening that serves the purge system. The purge system is connected between the gas delivery and exhaust system. A purge system is typically composed of gas inlet and outlet features that are designed to remove process byproducts, e.g., outgassed porogens, from a process chamber and prevent accumulation of process byproducts on all internal process chamber surfaces and direct flow cleaning gases. Typically, the minor outlet and inlet surface areas are the connections to gas delivery and exhaust systems.

The ratios of outlet to inlet may also be viewed in terms of a perimeter surrounding a plane of a cylindrical space bounded by the window and the wafer support. Purge gas is flowed from one side of the perimeter and exhausted from the other side. The inlet portions may span over 50% or over 75% of this perimeter around the wafer support. If the sum of all purge features regardless of feature geometry are considered to take up 100% of the perimeter of the purge system, then the exhaust features takes less than half of the perimeter, preferably less than 25% of the perimeter.

The purge system connects to a gas delivery system and a gas exhaust system, and includes a purge ring, also referred to as an open exhaust baffle. The baffle includes an upper and a lower portion. The upper and lower portions are assembled to provide the inlet and outlet openings for purge gas. The baffle may also include a quartz insert on the inlet side, a heater on the outlet side, and a shield on the outlet side. The heater is configured to heat chamber materials around the outlet, e.g., the baffle and the shield, to at least about 100° C. or 120° C. The heater may also heat other surrounding chamber materials, e.g., chamber walls and the gas exhaust system. The quartz insert and portions of the baffle forming the outlet may be made of a flame polished quartz and may have a surface polish roughness average of between about 4 and 63 angstroms, between about 4 and 32 angstroms, or between around 4 to 14 angstroms. Portions of the baffle may be coated with a UV absorbing material.

In certain embodiments, the chamber has four stations. Although every station includes the purge ring or baffle, not every station has a heater or shield. The major and minor outlet to inlet surface area ratios and perimeter dimensions may apply to one or more of the stations, not necessarily all. Because UV light is applied to the same wafer sequentially as the wafer indexes from station to station and porogen removals occurs early during the UV exposure, most of the porogen outgassing is expected to occur in the first few stations. These first few stations are configured with baffles particularly suited to removing outgassed porogens. In certain embodiments, the exhaust for the last station is reduced to increase purge gas flow in the other stations.

In certain embodiments, the chamber has only one or two stations. According to these embodiments, the stations are configured with gas inlet and exhaust features that remove porogen outgassed from the chamber. The exhaust feature may encompass less than 50% of a perimeter of the purge system, preferably less than 25% of the purge system.

In another aspect, the invention pertains to an apparatus for removing chemical species from a partially fabricated semiconductor wafer. The apparatus includes a curing chamber, a wafer support located in the curing chamber for holding a wafer, and a purge ring located in the curing chamber positioned between the wafer support and a window. The purge ring includes an inlet portion, an inlet plenum located in the inlet portion, an inlet baffle located in the inlet portion, an outlet portion, a heater located in the outlet portion and configured to heat the outlet portion, and an outlet channel located in the outlet portion. The inlet plenum is fluidly connectable to a gas source, preferably a purge gas source of nitrogen, argon, helium, or a mixture of these. The outlet channel is located substantially opposite the inlet baffle across the purge ring. A ring hole space is defined at least partially by the edges of inlet and outlet portions. The inlet baffle is operable to convey gas from the inlet plenum into the ring hole space, and the outlet portion is operable to convey gas and other matter out of the ring hole space. The major outlet to inlet surface area ratio may be greater than about 4. The minor outlet to inlet surface area ratio may be greater than about 2.

In yet another aspect, the present invention pertains to a method to remove outgassed porogen from a UV chamber. The method includes providing a purge ring having an inlet and an outlet area, heating the outlet area, and flowing an inert gas from a gas inlet across an underside of a window to the heated outlet area. The inert gas may be any of the commonly used inert gas, e.g., nitrogen, argon, helium, or a combination of these. The inert gas may be flowed between 4 and 100 slm (standard liters per minute) for a four-station chamber and have a residence time of less than about 125 seconds.

The outlet area may be heated to at least 100° C. It is believed that a heated outlet area reduces outgassed porogen deposits. Deposited porogen may be removed by flowing oxygen plasma or ozone to the chamber through the inlet and outlet areas. Also, ozone may be formed in situ by irradiating oxygen flowed into the chamber with UV light. The resulting ozone then cleans the window and other chamber areas.

These and other features and advantages of the invention will be described in more detail below with reference to the associated drawings.

DETAILED DESCRIPTION OF SPECIFIC EMBODIMENTS

Figure 1:
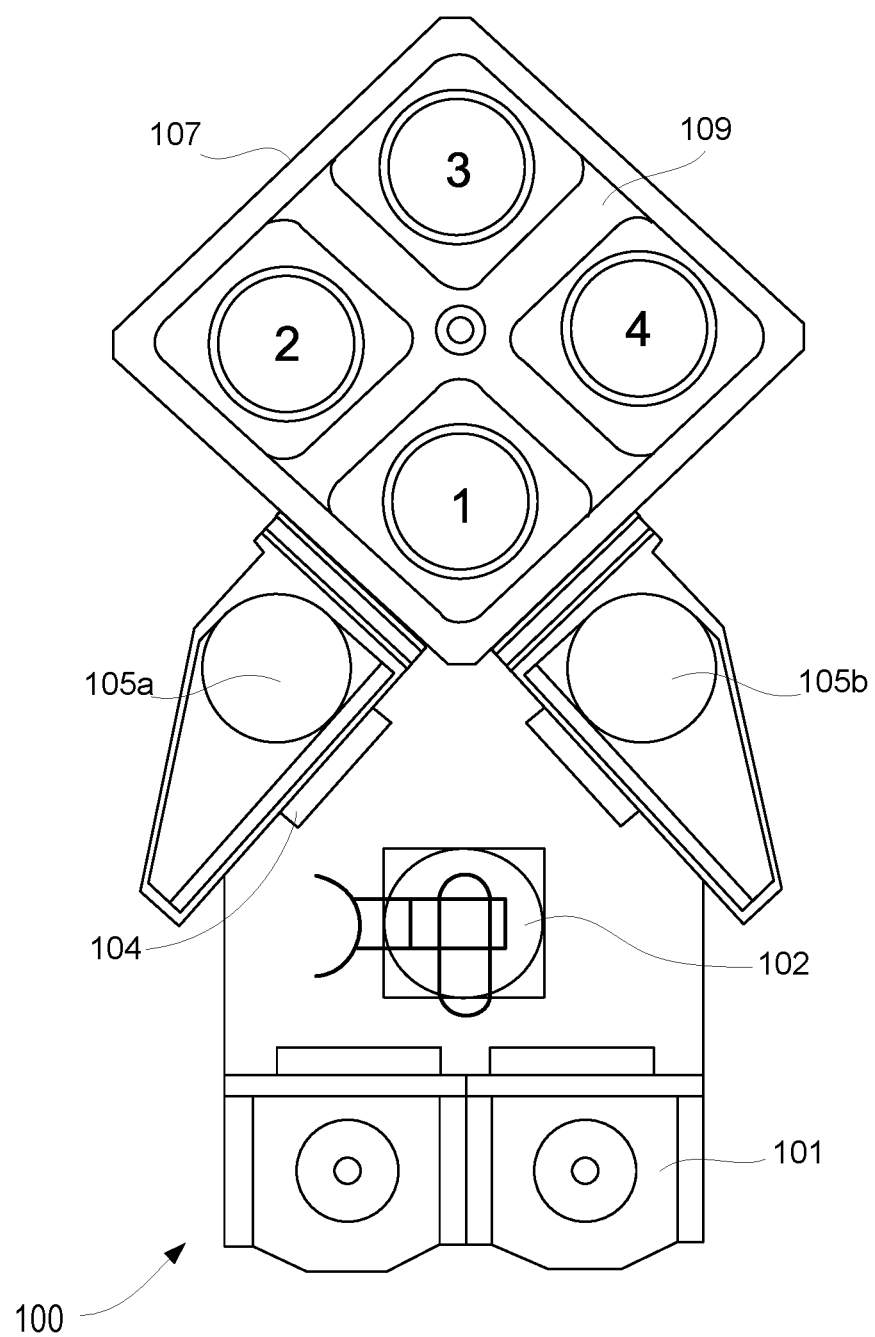
FIG. 1 is a schematic of a semiconductor processing apparatus configured to with a chamber in accordance with various embodiments.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "substrate" and "wafer" will be used interchangeably. The following detailed description assumes the invention is implemented on semiconductor processing equipment. However, the invention is not so limited. The apparatus may be utilized to process work pieces of various shapes, sizes, and materials. In addition to semiconductor wafers, other work pieces that may take advantage of this invention include various articles such as display face planes, printed circuit boards, solar cell wafers, Micro-Electro-Mechanical Systems (MEMS), and the like.

Introduction

UV treatment of semiconductor wafers has many applications including removing porogens, strengthening dielectric films, repairing damage to low k films, stabilizing FSG films, improving hermeticity and selectivity of SiC etch stop films, curing nitrides and oxides, extracting water produced in dielectric (e.g., silicon oxide) deposition, densification of dielectric materials, and increasing stress in dielectric films (for, e.g., strained gates). UV curing has also been employed to lower the k-value of other dielectric materials such as oxides deposited by pulse deposition layer (PDL) processes.

For example, as device geometry shrinks, integrated circuits (IC) require dielectric films with smaller capacitance values. IC manufacturers have obtained low capacitance by inducing porosity in these dielectric films. Inclusion of porosity in dielectric films is accomplished by co-depositing the backbone dielectric material (typically an organo-silicate glass or OSG) with a pore generator (typically an organic material). However, inducing this kind of porosity causes degradation in the mechanical properties of the film, reducing its ability to sustain subsequent integration steps without mechanical damage. After the deposition, the pore generator (porogen) must be removed from the ULK precursor film, and the backbone dielectric material strengthened for further processing. UV radiation can be used to achieve both the porogen removal and the strengthening of the backbone dielectric material. The UV radiation drives out the porogen from the dielectric film and rearranges the bond structure in the residual material to strengthen it and to render it capable of sustaining subsequent processing. The cured film may have an ultra-low dielectric constant (k) of about 2-2.5.

The curing of semiconductor wafers takes place in a chamber that may or may not be in a vacuum. A wafer is placed in the chamber and exposed to UV radiation. The process of curing ultra-low k (ULK) films on semiconductors can be time-consuming with cure times of up to twenty minutes. In multi-station ultraviolet processes, the porogen removal step tends to occur first, followed by the cross-link strengthening of the ULK film. The porogens are hydrocarbons that may deposit onto chamber interior walls, windows and other reactor parts. Porogens tend to outgas from the wafer in the first one or two stations, and outgas less or very little in latter stations. The porogen must be cleaned from the reactor periodically to avoid clouding the window through which the ultra-violet radiation enters the stations and/or depositing unwanted particles on the chamber internals walls and parts which can delaminate and contaminate the wafer.

Apparatus

FIG. 1 shows a schematic of a multi-station processing tool that is configured to perform UV cure in accordance with the present invention. The wafer enters the system 100 from a cassette loaded through a pod 101, such as the front opening unified pod (FOUP) used in 300 mm wafer systems. A robot 102, at atmospheric pressure, moves the wafer from the cassette to one of two load locks 105a or 105b. For example, the wafer enters the loadlock 105a through an atmospheric port 104 and is placed on a loadlock pedestal. The atmospheric port 104 to the atmospheric environment then closes; and the loadlock 105a is pumped down, to the same pressure or slightly above the pressure in the reactor 107. At the same time, the wafer is centered and aligned and may be heated in the loadlock on the pedestal. Then a transfer port to a reactor 107, maintained at a low pressure less than that of an atmosphere, such as a vacuum, opens, and another robot places the wafer into the reactor on a pedestal of a first station in the reactor. The above example used load lock 105a for ingress of the wafer, but load lock 105b may be used also.

The reactor 107 in the depicted wafer processing tool has four stations, numbered from 1 to 4. Each station is capable of performing ultraviolet radiation treatment simultaneously with the other stations. The wafer is indexed through the reactor stations using wafer indexing mechanism 109, which may include carrier rings and a spindle. At the end of processing at each station, the wafer is indexed to the next station for further processing. At the end of processing, the wafer is returned to station 1. The wafer then leaves the reactor through a transfer port to a loadlock 105a or 105b, where the wafer is cooled on the cooling pedestal before finally returning to the cassette in the pod 101. Because there are two loadlocks 105a and 105b, either one can be used for egress or ingress to the reactor, or both. In this particular wafer processing tool configuration, the only wafer access to the reactor 107 is through station 1, though in other configurations the loadlocks may access different stations.

Because the wafers are indexed from station to station at the same time, the amount of time each wafer spends at each station is the same. The UV cure time at each station would be a fraction of the total cure time required. In a four-station reactor, the cure time in the first station would be about ¼ of the total cure time. The stations in the multistation chamber shown in FIG. 1 share a same vacuum environment. Other configurations with single station chambers or chambers having more or fewer stations are possible.

In the case of ULK UV treatment, more of the porogen removal occurs in the initial stages of the UV radiation. Without a purge system, the porogen removed would deposit on surrounding surfaces, including the window and internal chamber parts. Techniques for forming low-k and ULK dielectric thin films are known in the art. A porogen-containing dielectric ULK precursor is formed by co-depositing the porogen with "backbone" materials. A preferred class of porogens includes polyfunctional cyclic non-aromatic compounds. Typical "backbone" precursor compounds include silane, alkylsilanes, alkoxysilanes, and siloxanes. Co-owned and co-pending U.S. patent application Ser. No. 10/672,311, filed Sep. 26, 2003, issued as U.S. Pat. No. 7,208,389 on Apr. 24, 2007, and having the title "Method of Porogen Removal from Porous Low-k Films Using UV Radiation.", which is hereby incorporated by reference in its entirety for all purposes, teaches systems and methods of depositing porogen-containing thin films and curing the thin films using UV radiation to form low-k dielectric material.

Figure 2A:
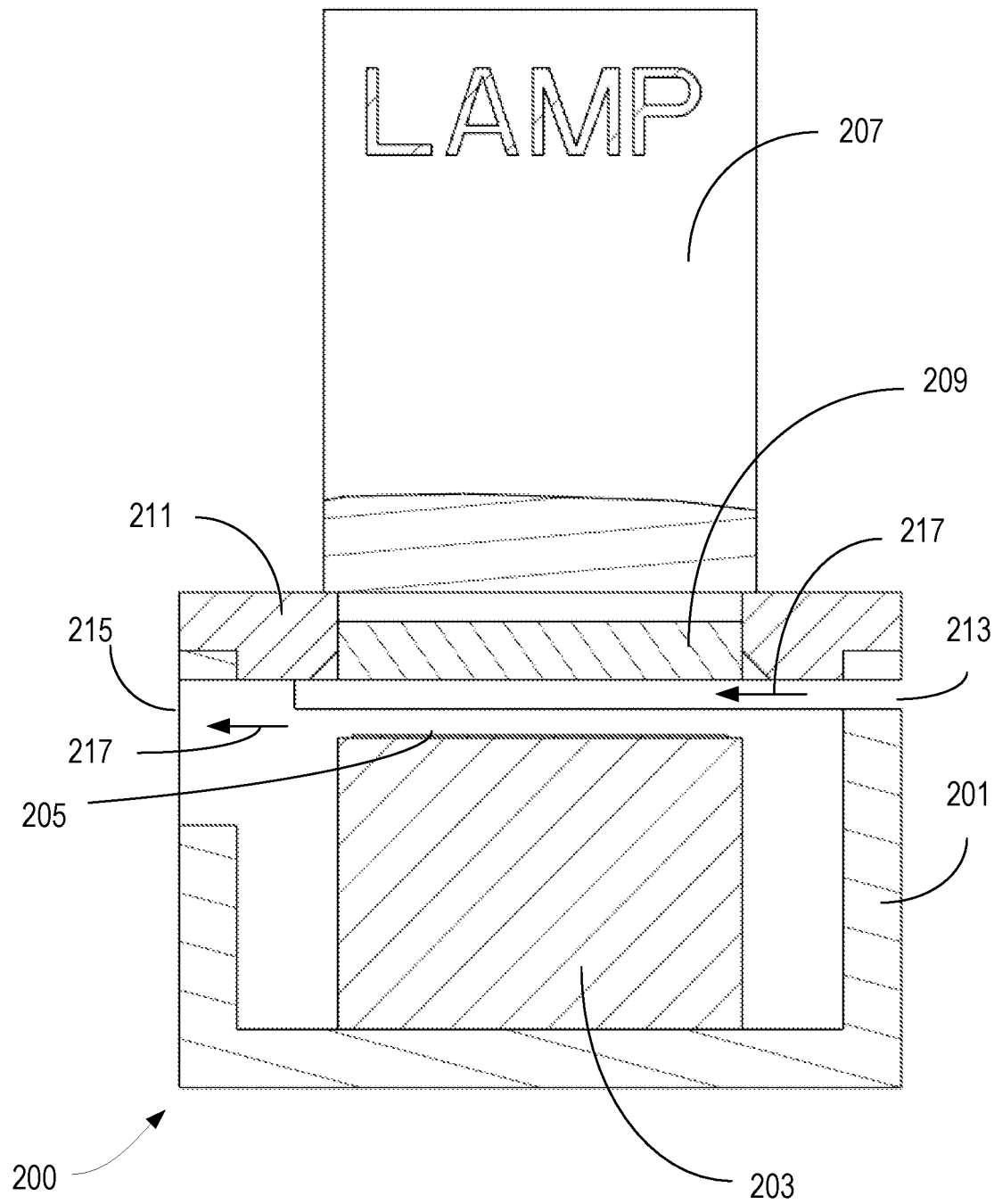
FIGS. 2A and 2B are cross-section schematic diagrams of a semiconductor processing chamber in accordance with various embodiments of the present invention.

FIG. 2A is a cross-section schematic diagram of a semiconductor processing chamber in accordance with various embodiments of the present invention. Chamber 200 includes a chamber body 201 and a wafer support pedestal 203, on which a wafer 205 is placed during UV processing. A lamp assembly 207 is positioned on top of the chamber across a window 209 from the wafer. The lamp assembly and window are mounted in a chamber top 211. UV radiation is generated inside the lamp assembly 207 and directed at the wafer, which is positioned on the pedestal 203 parallel to the window. UV chamber designs and configurations suitable for modification for the present invention are described in co-owned and co-pending U.S. patent application Ser. No. 11/115,576 filed Apr. 26, 2005, issued as U.S. Pat. No. 8,137,465 on Mar. 20, 2012, and having the title "Single Chamber Sequential Curing of Semiconductor Wafers," which is incorporated by reference in its entirety for all purposes.

Outgassed porogen from the wafer may deposit on the surrounding chamber parts, e.g., the interior surface of the window 209, internal chamber walls 201, underside of a top plate 211, and surfaces of the pedestal 203. As shown in FIG. 2A, purge gas is flowed from inlet 213 to outlet 215 across the interior surface of the window in a gas curtain. As the outgassed porogen leaves the vicinity of the wafer, it is swept by the purge gas toward the outlet 215 where most of it exits the chamber before it can deposit on a surface.

Figure 2B:
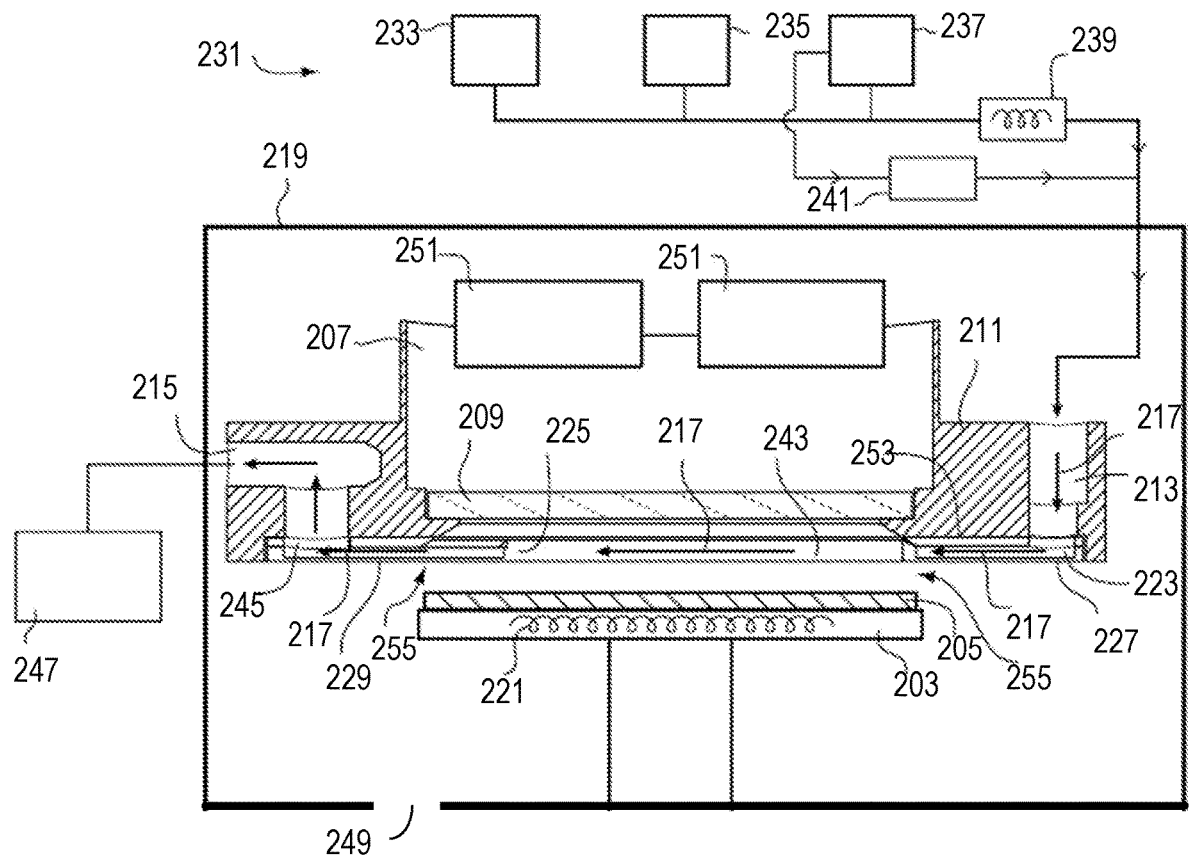

FIG. 2B shows a more detailed schematic diagram of a portion of a processing chamber in accordance with various embodiments of the present invention. Enclosure 219 may be a chamber shown without chamber walls or may be a station that is a part of a multiple station chamber. Enclosure 219 includes a chamber top plate 211, on which a lamp assembly 207 is mounted. The lamp assembly as shown includes two lamps 251. The window 209 and purge gas inlet 213 and outlet 215 are also installed in the top plate 211. The top plate may be cooled. On the interior side of the window 209 is the pedestal 203, which may be temperature controlled. The temperature control mechanism may include a heater or a chiller 221. The heater may be an electrical resistance heater or one that uses a thermodynamic fluid. The fluid temperature may be controlled such that in certain instances it is heating the pedestal and in other instances it is cooling the pedestal. A wafer 205 is placed on the pedestal 203.

A gas delivery system 231 delivers gas from sources 233, 235, and 237 to the chamber. Suitable purge gas may include nitrogen, argon, helium, or a combination of two or more of these. Gas sources 233 and 235 may include a single gas that is later mixed into a desired mixture or may include mixed sources. Gas source 237 also serves as a source for the remote plasma clean module 241. The purge gas or mixture may be heated through inline heater or heat exchanger 239 before entering the chamber at inlet 213. The flow path of the purge gas is indicated by arrows 217.

The purge gas enters the chamber top 211 at inlet 213, and enters the purge ring 225 at inlet opening 223. The purge ring includes an inlet portion 227 and an outlet portion 229. The purge gas flows through inlet portion 227 into a ring hole space 243 between the window 209 and the wafer 205. The purge gas then flows into the outlet portion 229 and exits the purge ring at the outlet opening 245 and the chamber top at outlet 215 to a vacuum source 247.

During UV curing of a wafer deposited with a ULK structure former and a porogen, the radiation energy from the UV light dissociates the porogen and liberates the porogen or portions of porogen from the structure former. The volatile porogen, usually hydrocarbons, enters a purge space 255 directly above the wafer. As the purge gas flows through purge ring hole space 243, the purge gas carries the outgassed porogen along to the outlet portion and exits the chamber. The outgassed porogen may deposit on internal chamber surfaces, e.g., bottom surface 253 of the top plate, internal side of window 209, and underside surfaces of the inlet portion 227 and outlet portion 229.

During chamber clean, oxygen or another cleaning gas, flows from source 237 into the remote plasma clean module 241 and into the chamber top at inlet 213. Alternately, ozone may be formed by pumping oxygen directly into the inlet 213 and flowing it across the lamps which turns some of it into ozone used for cleaning. From there the cleaning gas follows the same path as the purge gas to exit the enclosure at outlet 215. The cleaning gas reacts with deposited porogen to remove it from chamber materials. In certain embodiments, the cleaning gas also exits the enclosure from a bottom pump out port 249 at all times during the clean, for portions of the clean time, or not at all. It is believed that more effective cleaning of certain areas of the chamber, notably the areas at or below the wafer plane is achieved by pumping out the cleaning gas from port 249.

Figure 3A:
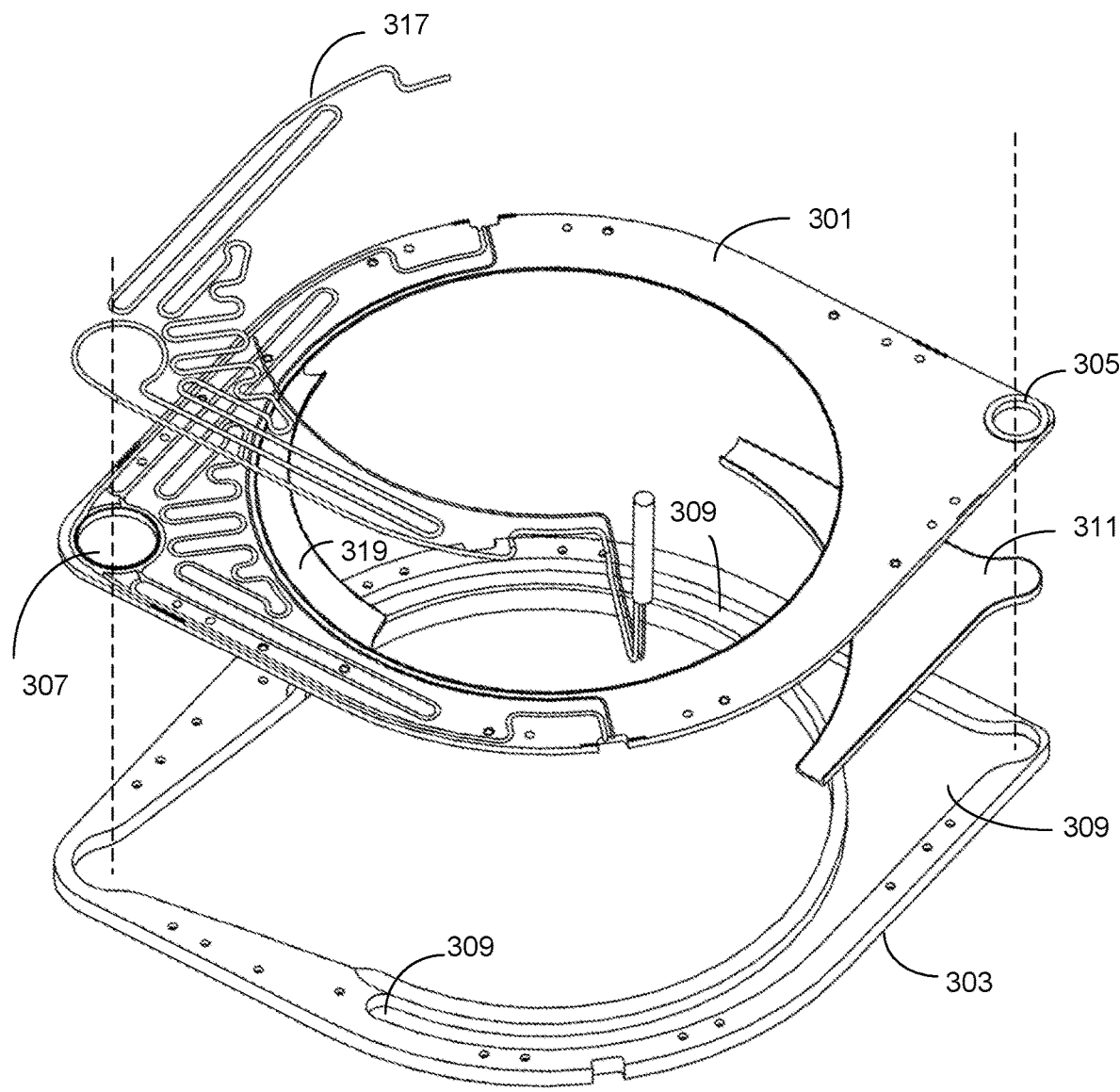
FIG. 3A is an exploded diagram of a purge ring system in accordance with various embodiments of the present invention.

FIG. 3A is an exploded diagram of a purge ring assembly in accordance with various embodiments of the present invention. Upper baffle 301 and lower baffle 303 are assembled to form the purge ring. Purge gas enters the purge ring at inlet opening 305 and exits the purge ring at outlet opening 307. An inlet portion 309 is a portion of the purge ring around a space formed between the upper baffle 301 and lower baffle 303 from which the purge gas flows into the ring hole space.

Figure 3B:
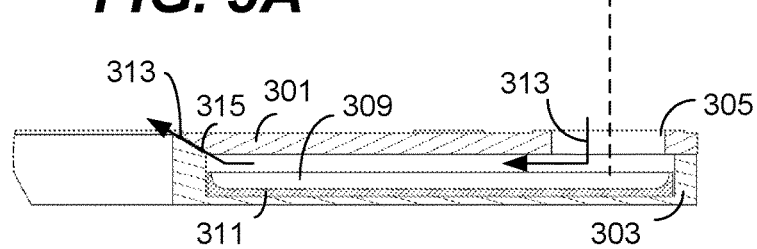
FIG. 3B is a cross-section view of an inlet portion of the purge ring system of FIG. 3A.

FIG. 3B is a cross-section view of an assembled inlet portion around the inlet opening 305. A quartz insert 311 may be optionally sandwiched between the upper baffle 301 and lower baffle 303. The quartz insert 311 may be highly polished and improves purge gas flow and reduces clean gas species recombination through the inlet portion 309. The quartz insert 311 may be made of flame polished quartz and may have average surface roughness of between about 4 and 63 angstroms, between about 4 and 32 angstroms, or between around 4 to 14 angstroms. Arrows 313 shows direction of gas flow. Upon entering the purge ring at inlet 305, the purge gas turns and flows through the inlet portion 309 and out to the ring hole space through an inlet slit 315. The inlet slit 315 serves to maximize purge gas velocity and redirects the purge gas at the window (not shown). As discussed above, keeping the window clear of deposited porogen allows continued transmission of UV radiation through the window. Note that as shown in FIG. 3A, the inlet portion 309 spans about 75% of the ring hole space. In other embodiments, the inlet portion may span over 50% of a perimeter around the wafer support (i.e., ring hole space), or over 75% of the perimeter.

In some embodiments, a heater 317 is coupled to an outlet portion of the purge ring. The heater 317 serves to heat a portion of the purge ring. Although the purge gas itself may be heated to 200° C. or higher, the purge ring temperature may be much less. Higher temperature porogen may more readily deposit onto the colder outlet portion. It is believed that heating the outlet portion of the purge ring reduces outgassed porogen deposits. The heater is not limited to the design shown. Any kind of heater that is capable of maintaining the outlet portion at about 100° C. or higher may be used. In certain embodiments, a heater shield 319 is used in conjunction with heater 317. The heater shield 319 is attached to the upper baffle to further improve the flow dynamics of the purge gas through the ring hole space. The heater shield is also actively or passively heated to prevent the accumulation of porogen on itself and the areas it covers. The heater shield may be made of quartz or another material suitable for use inside a process chamber in a UV environment. One side of the shield preferably is shaped to conform to the surrounding chamber parts while other side by which the purge gas flows, is preferably shaped to improve the flow dynamics of the purge gas and direct the purge gas toward the outlet. For example, the purge gas flow side may be very smooth and having a shape designed to reduce drag. The average surface roughness of between about 4 and 63 angstroms, between about 4 and 32 angstroms, or between around 4 to 14 angstroms.

In certain embodiments, the baffle material at the outlet portion may be made of a highly polished material so that the outgassed porogen is less likely to deposit thereon. The highly polished material may be a highly polished quartz or other material. The material may be made of flame-polished quartz and may have average surface roughness of between about 4 and 63 angstroms, between about 4 and 32 angstroms, or between around 4 to 14 angstroms.

A particular feature of the purge ring involves its dimensions. A purge ring having a major outlet to inlet surface area ratio greater than about 4, 5, or is about 6 is found to be particularly effective at reducing deposits. This major outlet to inlet surface area ratio preferably applies for at least one station in a multi-station chamber.

Figure 4A:
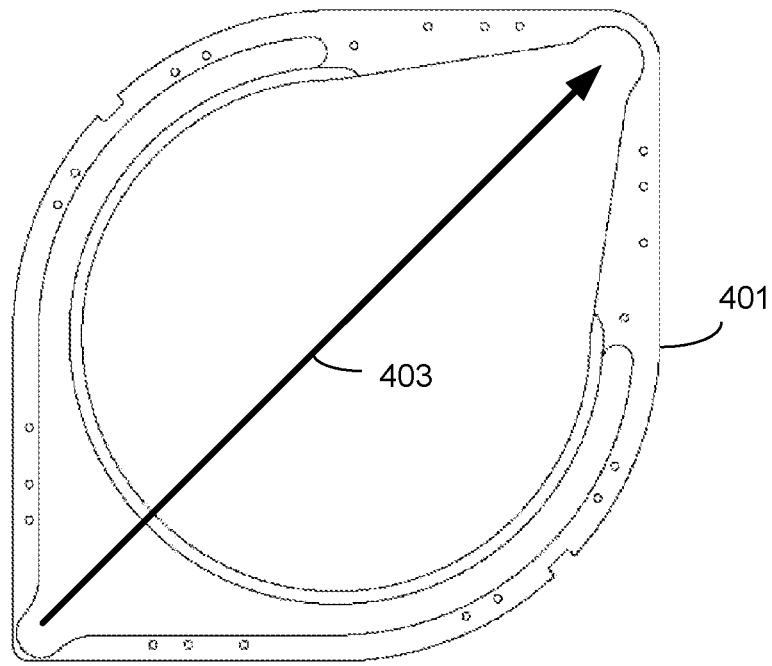
FIGS. 4A and 4B are schematic diagrams showing the purge gas flow and major inlet and outlet surface areas in accordance with various embodiments of the present invention.
Figure 4B:
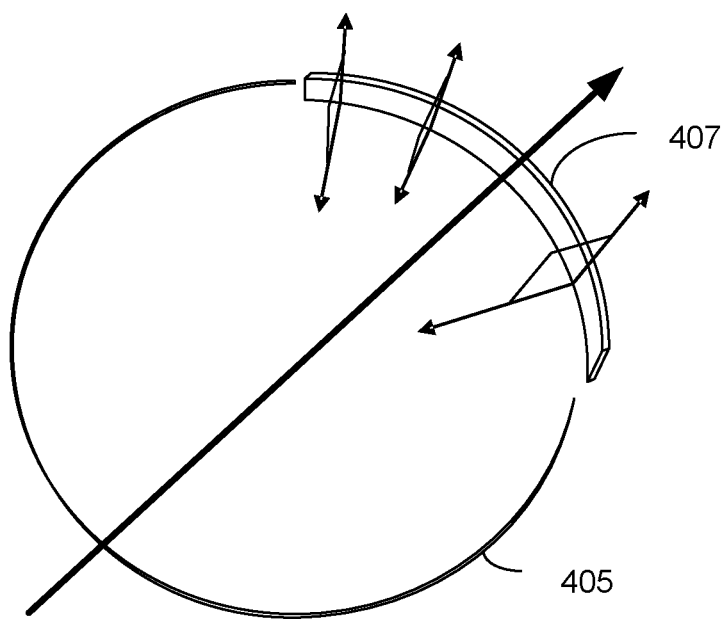

FIG. 4A shows a purge ring 401 and an arrow 403 showing the direction of purge gas flow. As shown, purge gas flows from the inlet portion to the outlet portion. The inlet portion surrounds a large portion of the ring hole space and has a narrow inlet slit as an opening, shown as surface 405. The outlet portion surrounds a smaller portion of the ring hole space, but has a much wider opening, shown as surface 407. As used in this disclosure, the major inlet surface area is the combined inlet sectional surface area of all features of any geometry that serve as final restrictions on the inlet path of a gas. For the purge ring of FIG. 4A, the inlet slit is the final restriction on the inlet path of a gas; thus, the surface 405 is the area of the slit that is perpendicular to the wafer. The major outlet surface area is the combined sectional surface area of all features of any geometry that are perpendicular to the wafer plane that are used for exhausting gases. For the purge ring of FIG. 4B, the major outlet surface area is shown as item 407. The smaller arrows indicate direction of perpendicularity to the wafer plane. These surface areas may be calculated using an imaginary surface that is perpendicular to the direction of gas flow and need not be planar, or may be in three dimensions. For the surfaces of FIG. 4B, the surfaces are portions of cylinders. Of course other purge ring design and configurations may yield surfaces having other shapes.

A purge system is typically composed of gas inlet and outlet features that are designed to remove process byproducts, e.g., outgassed porogens, from a process chamber and prevent accumulation of process byproducts on all internal process chamber surfaces and direct flow of cleaning gases. The purge system is a part of the chamber that connects to a gas delivery system, such as item 231 of FIG. 2B, and a gas exhaust system, such as item 247 of FIG. 2B.

Figure 5A:
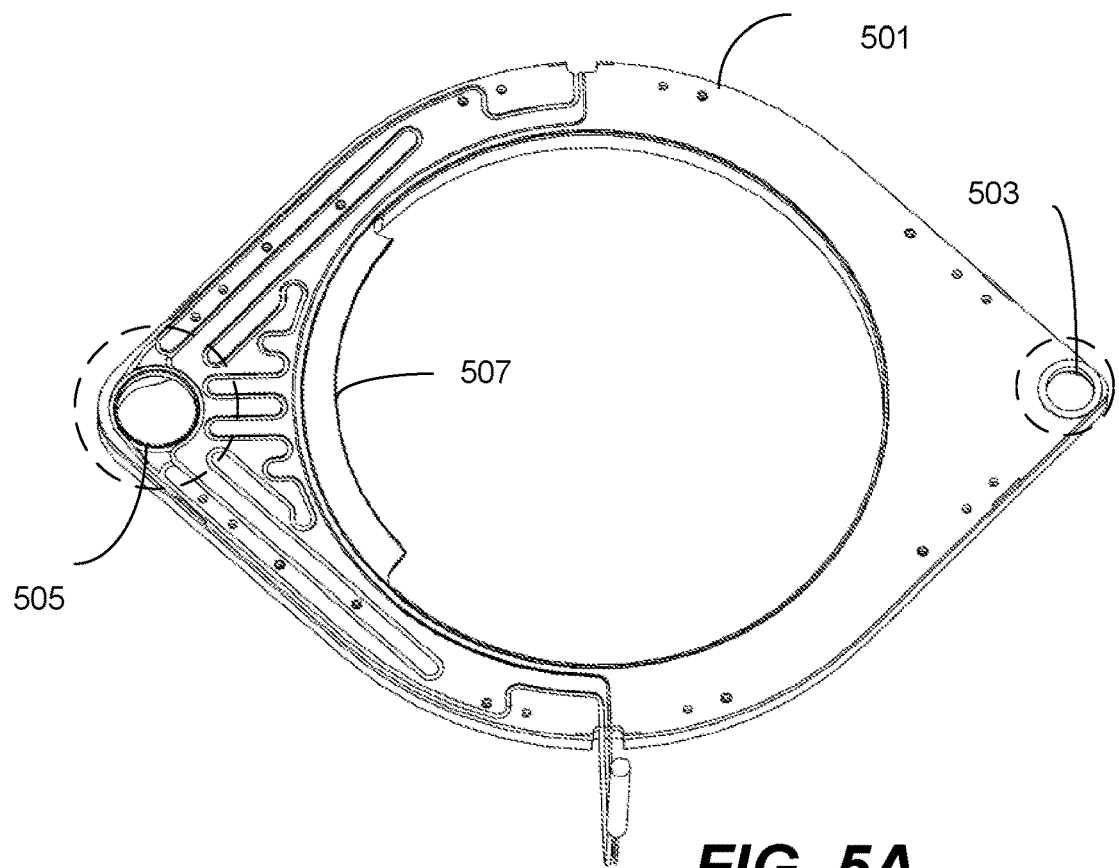
FIGS. 5A and 5B are a top view and a bottom view an assembled purge ring showing the minor inlet and outlet opening areas in accordance with various embodiments of the present invention.
Figure 5B:
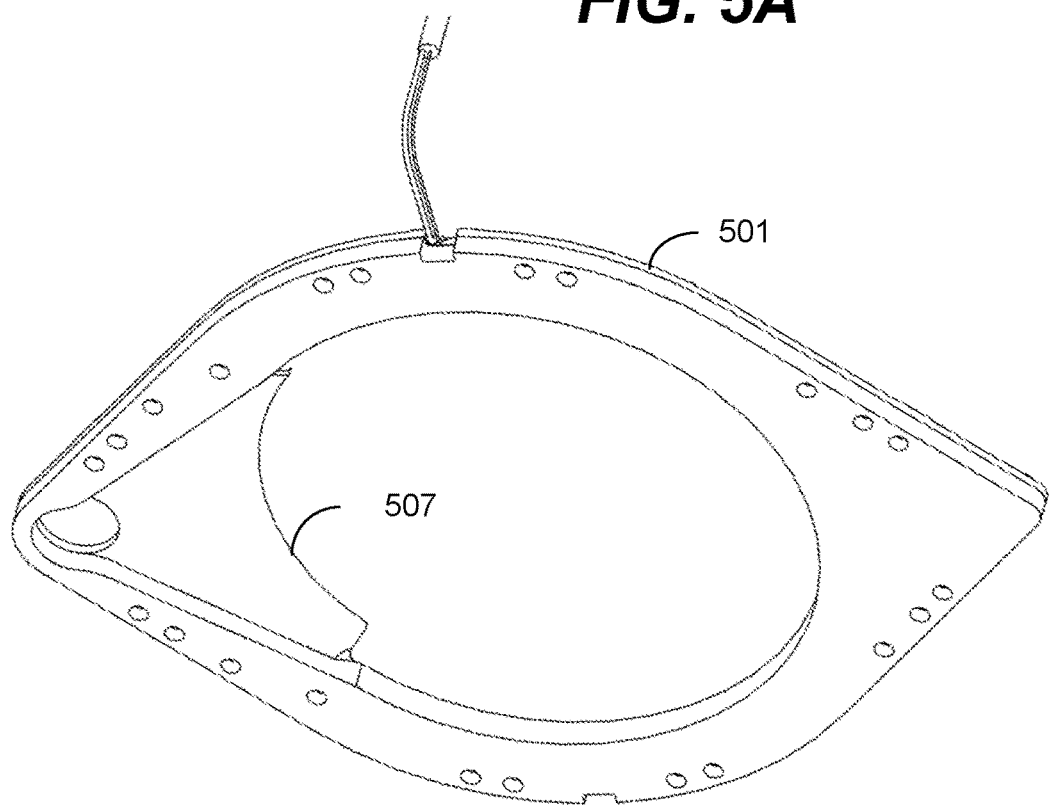

The purge system may be defined relative to the minor outlet to inlet surface area ratio. FIGS. 5A and 5B are top and bottom views, respectively, of a baffle assembly 501. The minor outlet surface area 505 is a cross sectional opening of primary gas exhaust opening used to remove gases from the purge system. The minor inlet surface area 503 is the cross sectional opening of primary gas delivery opening that serves the purge system. The minor outlet to inlet surface area ratio is greater than about 2, 2.5 or is about 3. Typically, the minor outlet and inlet surface areas are the connections to gas delivery and exhaust systems.

The purge system may also be defined in terms of a perimeter surrounding a plane of a cylindrical space bounded by the window and the wafer support. The portion of the perimeter used by outlet and inlets may be defined by a ratio. Purge gas is flowed from one side of the perimeter and exhausted from the other side. The inlet portions may span over 50% or over 75% of this perimeter around the wafer support. If the sum of all purge features regardless of feature geometry are considered to take up 100% of the perimeter of the purge system, then the exhaust features takes less than half of the perimeter, preferably less than 25% of the perimeter. Note that this ratio is opposite of the major and minor surface area ratios as discussed above. The outlet surface areas tend to be larger than the inlet surface areas, both as defined for major and minor surface areas. The outlet perimeter, on the other hand, may be smaller than the inlet perimeter.

Each station in a multi-station chamber may be configured differently as to the heater, heater shield, and the dimensions of outlet and inlet surface areas. As discussed above, in a four station chamber, porogen outgassing tends to occur in the first few stations. Thus, the first one or two or three stations have a greater need for purge gas flow and heating. In certain embodiments, the first two stations may be configured with outlet portion heating, heat shield, quartz insert, and a purge ring having dimensions for maximum purge gas flow and flow characteristics. Another station may be configured without one or more of these features because of the reduced likelihood of porogen outgassing. Yet another station may not be configured with any of the features in order to maximize purge gas flow in the other stations.

Process Flow

Figure 6:
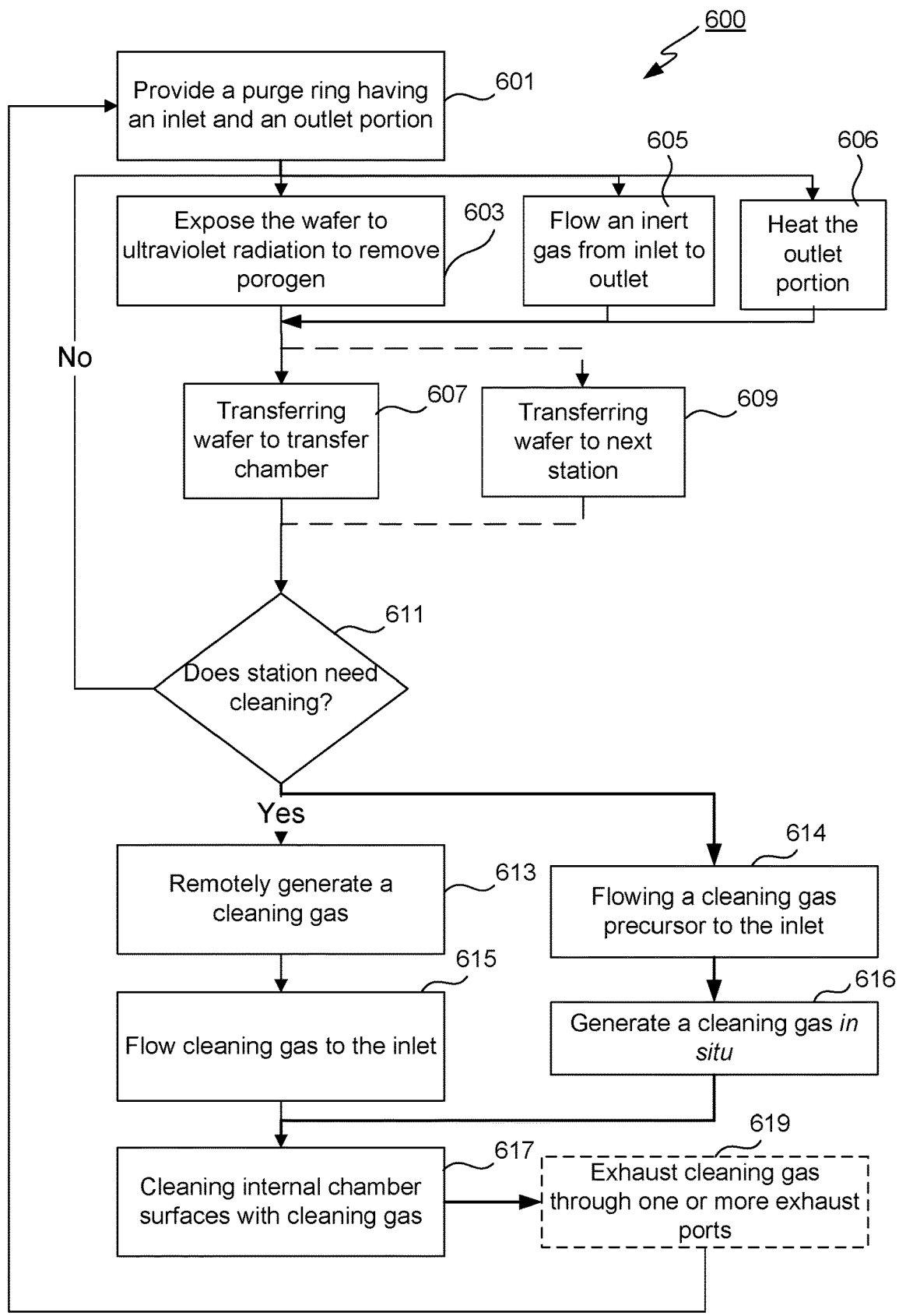
FIG. 6 is a process flow diagram of a method to remove outgassed porogen from a UV-cure chamber in accordance with various embodiments of the present invention.

FIG. 6 is a process flow diagram showing a method 600 of removing outgassed porogen from a UV chamber. The outgassed porogen may be gaseous or may be deposited on an internal chamber surface. The process addresses both of these situations.

A purge ring having an inlet and an outlet portion is provided in operation 601 in a UV-cure chamber. As discussed above, UV curing is a semiconductor processing method used in various stages of semiconductor manufacturing. A UV-cure chamber may be used to perform one or more of other processes where outgassing is not a concern. When porogen removal is required, then the purge ring may be provided in the chamber.

A wafer having deposited ULK precursor film is provided in a UV exposure area. These following operations may overlap or even occur simultaneously. One or more of the operations may continue even if the wafer has been removed. In operation 603, a wafer is exposed to ultraviolet (UV) radiation to remove porogen. This is the operation that outgases the porogen. At around the same time, an inert gas is flowed from an inlet or an outlet of a purge ring, in operation 605. The purge ring is associated with a wafer processing station. The inert gas may be nitrogen, argon, helium, or a combination of these. Preferably, the inert gas is flowed during the entire exposure operation or during when outgassed porogen is present. The inert gas may be flowed between 4 and 100 slm (standard liters per minute) for a four-station chamber and have a residence time of less than about 125 seconds. The inert gas may be heated prior to the inlet. In certain cases, the inert gas is heated to about 200° C.

A portion of the purge ring around the outlet is heated in operation 606. The outlet portion is heated to and maintained at higher than 100° C., or to at least 120° C. It is believed that a heated outlet reduces porogen deposits on chamber surfaces. The heating of the outlet portion may occur before the wafer is exposed to UV light. The outlet portion preferably is maintained at an elevated temperature during porogen outgassing, which may occur soon after the onset of UV curing.

After the UV exposure, the wafer may be transferred to a transfer chamber in operation 607 or to the next station in operation 609. As discussed above, a multi-station chamber may include two or stations for sequential processing of wafers. Each wafer proceeds sequentially to each station while other wafers are simultaneously processed at different stations. If a multi-station chamber is used, then the wafer may be transferred to the next station for further processing. If the last station was reached or if the chamber has only one station, then the wafer may be transferred to a transfer chamber.

After a defined interval, a decision is made whether the station needs cleaning, in operation 611. This decision may be made based on a loss of UV transmission through the window, the number of wafers processed, elapsed time, the total time of UV exposure, the thickness of film processed, output of a detector, or other variables. The decision may be made by an operator or a computer programmed with instructions to keep track of the defined interval. If the station does not need cleaning, then the process repeats from operations 603, 605, and 606. If the station needs cleaning, then a cleaning procedure is initiated.

Deposited porogen may be removed by flowing remotely generated cleaning gas to the chamber. A cleaning gas may be remotely generated or generated in situ. (see operation 613 and 616). A remote plasma generator may use oxygen to generate oxygen plasma as the cleaning gas. Alternatively, ozone may be produced via a generator and flowed in through the baffle inlet. Ozone for cleaning may be created in situ in the baffle by flowing oxygen into the inlet and using the UV lamps to make ozone as shown in operations 614 and 616. The cleaning gas is flowed to the inlet, where it may follow the same flow path as the purge gas or in some cases flow out of the chamber from a bottom pumping port. Note that the chamber cleaning occurs with no wafers in the chamber.

The cleaning gas may be flowed to one or more stations or all of the stations in a multi-station chamber. The cleaning gas removes deposited porogen from internal chamber surfaces. In certain embodiments, the cleaning gas follows a different flow path from the purge gas. Instead of flowing out through the outlet (operation 617), the cleaning gas may optionally exit the chamber through a bottom port (operation 619), shown as item 249 in FIG. 2B. It is believed by directing the cleaning gas to the bottom of the chamber during part of the cleaning time, more deposited porogen is removed from certain internal chamber parts or cleaning time is shortened.

Results

Implementations of the features of the present invention resulted increased interval between chamber cleans and the duration of the chamber clean. These improvements increase throughput.

In a comparative example, maximum batch sizes of 75 wafers can be processed between chamber cleans. The total clean time was about one hour, consisting of 20 minutes of remote plasma clean at a pressure of 1 Torr and a flowrate of 12 SLM, followed by a 40 minute in-situ clean with Oxygen gas at 700 Torr and 50 SLM.

In a first example, a batch of 75 wafers containing ULK film was exposed to UV light for 2.5 minutes each, with the outlet portion heated to about 120° C. The chamber was cleaned with 15 minute remote plasma clean at a pressure of 1 Torr and a flowrate of 8 SLM, followed by a 15 minute in-situ clean with Oxygen gas at 700 Torr and 30 SLM in a four-station chamber. The in-situ clean uses UV light from the lamps to convert oxygen gas flowing into the chamber into ozone ($O^3$). The ozone reacts with the accumulated porogen, removing it from the window and chamber surfaces. In this example, a heater, a heat shield, and a quartz insert at the inlet were used.

In a second example, bottom pumping was used during remote plasma cleaning. A batch of 75 wafers containing ULK film was exposed to UV light for 2.5 minutes each, with the outlet portion heated to about 120° C. The chamber was cleaned with 5 minute remote plasma clean at a pressure of 1 Torr and a flowrate of 8 SLM, followed by a 15 minute in-situ clean with Oxygen gas at 700 Torr and 30 SLM in a four-station chamber. In this example, a heater, a heat shield, and a quartz insert at the inlet were used. The total cleaning time was the same as the first example, but the remote plasma clean time is reduced, resulting in reduced cost.

Both of these examples show dramatic improvement from the comparative example. The total cleaning time is reduced from about one hour to about 30 minutes. For a typical processing time of 2.5 minutes per wafer, the resultant improvement in throughput is 5 wafers per hour, an improvement of approximately 11%. Porogen buildup is significantly reduced in the areas of the chamber above the wafer plane and significantly reduced in areas at or below the wafer plane when inspected before clean. Porogen remaining in the areas of the chamber above the wafer plane can be completely removed in the clean process, whereas without this invention, large, thick deposits remain in the exhaust areas of the chamber and the areas of the top plate near the exhaust after a clean of any duration. Areas of the chamber at and below the wafer plane show visible reduction in remaining porogen accumulation post-clean.

Although various details have been omitted for clarity's sake, various design alternatives may be implemented. For example, the apparatus and methods discussed in this disclosure applies not only to porogen removal, but all UV processing where compounds may be outgassed and need to be removed from the chamber. Therefore, the present examples are to be considered as illustrative and not restrictive, and the invention is not to be limited to the details given herein, but may be modified within the scope of the appended claims.

What is claimed is:

1. An apparatus comprising:
an upper baffle having a central circular opening, an outlet opening, and an inlet opening arranged on a common plane and each extending from a first side of the upper baffle to a second side of the upper baffle opposite the first side; and
a plurality of holes located at locations along outer edges of the upper baffle and arranged so as to align with a corresponding plurality of holes in a lower baffle when the upper baffle is mounted to the lower baffle such that the first side is in contact with the lower baffle, wherein:
the central circular opening, the outlet opening, and the inlet opening are arranged along a common axis,
the central circular opening is interposed between the inlet opening and the outlet opening,
the central circular opening is larger in size than either the inlet opening or the outlet opening,
the inlet opening is smaller than the outlet opening, and
the upper baffle includes:
two arcuate outer edges that are located on opposite sides of the common axis and are concentric with, and radially offset outward from, the central circular opening,
two pairs of linear outer edges that are each tangent to one of the arcuate outer edges at one end, wherein each linear outer edge of each pair of linear outer edges is positioned opposite the other linear outer edge of that pair of linear outer edges with respect to the common axis.

2. The apparatus of claim 1, wherein the upper baffle includes a second sloped surface that:
extends radially outward from a second edge portion of the central circular opening and away from the second side of the upper baffle, and
has an outermost edge that is formed by an intersection of the second sloped surface and the first side.

3. The apparatus of claim 2, wherein the second edge portion extends around approximately three quarters of the central circular opening.

4. The apparatus of claim 1, further comprising a heater configured to heat a region of the upper baffle between the outlet opening and the central circular opening.

5. The apparatus of claim 4, wherein the upper baffle has a serpentine channel in the second side and the heater is a resistive heater that is located in the serpentine channel.

6. The apparatus of claim 5, wherein:
the second side has a first region and a second region,
the first region includes the outlet opening and extends up to a boundary that passes through the center of the central circular opening, is parallel to the common plane, and is perpendicular to the common axis,
the second region includes the inlet opening and extends up to the boundary, and
the serpentine channel follows a path that meanders throughout the first region.

7. The apparatus of claim 6, wherein the path does not meander throughout the second region.

8. The apparatus of claim 1, further comprising a heater shield that has a first sloped surface that:
extends radially inward from a first edge portion of the central circular opening nearest the outlet opening,
has an innermost edge that is offset from the second side such that the second side is interposed between the first side and the innermost edge, and
forms an acute angle with respect to the common plane.

9. The apparatus of claim 8, wherein the heater shield is made of quartz.

10. The apparatus of claim 8, wherein the heater shield has an average surface roughness of between about 4 Å and about 63 Å.

11. The apparatus of claim 8, wherein the heater shield has an average surface roughness of between about 4 Å and about 14 Å.

12. The apparatus of claim 8, wherein the first edge portion extends around approximately one quarter of the central circular opening.

13. The apparatus of claim 8, wherein the upper baffle includes a second sloped surface that:
extends radially outward from a second edge portion of the central circular opening and away from the second side of the upper baffle, and
has an outermost edge that is formed by an intersection of the second sloped surface and the first side.

14. The apparatus of claim 1, further comprising:
a lower baffle that is mounted to the upper baffle and that has an opening with an arcuate portion that is generally coradial with the central circular opening and that transitions to linear portions at either end that extend towards the outlet opening, thereby generally defining a teardrop when viewed along a direction normal to the common plane.

15. The apparatus of claim 14, wherein:
the lower baffle further includes a recess defined, at least in part, by an inner arcuate side wall that is concentric with the central circular opening, offset radially outward from the central circular opening, and symmetric about the common axis, and
the inner arcuate side wall extends around approximately three quarters of the central circular opening.

16. The apparatus of claim 15, wherein:
the lower baffle includes a sloped surface that extends from an upper edge of the inner arcuate side wall to an elevated edge that is concentric with the central circular opening and offset towards the upper baffle and from a plane defined by the upper edge.

17. The apparatus of claim 16, wherein:
the upper baffle includes a sloped surface that complements the sloped surface of the lower baffle and is offset from the sloped surface of the lower baffle such that an angled slit volume is defined between the two sloped surfaces, and
the angled slit volume is fluidically connected with the recess.

18. The apparatus of claim 17, further comprising a quartz insert, wherein:
the recess has a floor surface that is offset from the surface of the lower baffle that contacts the first side of the upper baffle in a direction perpendicular to the common plane,
the apparatus further includes a quartz insert that is positioned in the recess and in contact with the floor surface,
the quartz insert has an arcuate edge that butts up against the inner arcuate sidewall and extends around approximately one quarter of the central circular opening,
the quartz insert covers substantially all of the floor surface between the arcuate edge and the inlet opening, and
the quartz insert is symmetric about the common axis.

19. The apparatus of claim 18, wherein the quartz insert is flame-polished with an average surface roughness of between about 4 Å to 63 Å.

20. The apparatus of claim 18, wherein the quartz insert is flame-polished with an average surface roughness of between about 4 Å to 16 Å.

* * * * *